(12) United States Patent
Chen et al.

(10) Patent No.: US 7,944,297 B2
(45) Date of Patent: May 17, 2011

(54) CLASS D AMPLIFIER

(75) Inventors: Ming-Hsiung Chen, Taipei (TW);
Shang-Shu Chung, Taipei (TW);
Tung-Sheng Ku, Taipei (TW)

(73) Assignee: Amazing Microelectronic Corp., Taipei County (TW)

( * ) Notice: Subject to any disclaimer, the term of this patent is extended or adjusted under 35 U.S.C. 154(b) by 103 days.

(21) Appl. No.: 12/332,949

(22) Filed: Dec. 11, 2008

(65) Prior Publication Data
US 2009/0302943 A1 Dec. 10, 2009

(30) Foreign Application Priority Data

Jun. 6, 2008 (TW) .............................. 97121092 A

(51) Int. Cl.
*H03F 3/217* (2006.01)
(52) U.S. Cl. ...................... 330/251; 330/10; 330/207 A
(58) Field of Classification Search .................. 330/10, 330/251, 207 A; 375/238; 370/212; 332/109
See application file for complete search history.

(56) References Cited

U.S. PATENT DOCUMENTS 7,385,444 B2 * 6/2008 Kurokawa ..................... 330/10

* cited by examiner

*Primary Examiner* — Hieu P Nguyen
(74) *Attorney, Agent, or Firm* — Patterson & Sheridan, LLP; Keith P. Taboada

(57) ABSTRACT

A class D amplifier including a PWM circuit, a buffer amplifying circuit, a low-pass filter, and two current sources is provided. The PWM circuit transfers an analog signal into a PWM signal. The buffer amplifying circuit amplifies the PWM signal and generates an amplified signal. The low-pass filter will filter high frequency components out from the amplified signal and then transmit the filtered signal to a loading of the class D amplifier. The two current sources provide currents flowing into and out from a feedback node in the PWM circuit, respectively. The charging and discharging provided by the two current sources can generate a triangular signal for the PWM circuit.

10 Claims, 7 Drawing Sheets

CLASS D AMPLIFIER

BACKGROUND OF THE INVENTION

1. Field of the Invention

The invention relates to a class D amplifier circuit. In particular, the invention relates to a PWM circuit in a class D amplifier.

2. Description of the Prior Art

The class AB amplifier and a class D amplifier and is both power saving and has better tone quality than the class A amplifier that provides lower distortion, but it has higher power consumption, and class B amplifier has lower power loss, but has crossover distortion, hence widely used in consumer stereo and audio-visual equipment at present. The amplifier's main difference is the class AB amplifier uses a linear action region to amplify signal by power transistor, a class D amplifier technology is used for the PWM to amplify signal.

Please refer to FIG. 1. FIG. 1 shows a basic block diagram of half-bridge class D amplifier. The class D amplifier comprises of an integrator 102, a comparator 104, a pre-driver 106, a power amplifier circuit 108 and a low-pass filter 110. As show in FIG. 1, an input end of the integrator is used in receiving an analog signal V1, and uses a resistor R couples to another input end and an output end of a power amplifier circuit.

Analog signal V1 generates a voltage V2 after going through the integrator 102. The integration result compares with a normal triangular wave by comparator 104. The triangular wave signal $V_{TRI}$ can be a sampling signal of the integrate result V2. Therefore, in order to get a better sampling result, the triangular wave $V_{TRI}$ frequency is usually larger than the best high frequency of the analog audio signal V1.

When V2 voltage is higher than $V_{TRI}$, the output result of the comparator 104 can be a high level pulse wave signal; When V2 voltage is smaller than $V_{TRI}$, the output result of the comparator 104 can be a low level pulse wave signal. The integrator 102 and the comparator 104 are usually called a PWM circuit. The original analog audio signal is able to transform into a PWM signal of digital type by the PWM circuit; the amplitude value of the original analog signal direct ratio to part of the high level of pulse width in the digital signal.

Then the output voltage V3 of the comparator 104 can be amplified by pre driver 106, and not only drives a power amplifier circuit 108, but also controls and turns on or off the power transistor M1, M2. The power amplifier circuit 108 is used for amplifying signal. The low-pass filter 110 connected to the output end of the power amplifier 108 comprises an inductance and a capacitor, and the low-pass filter 110 to filter a carrier wave in PWM signal, and return the wave of the analog audio signal. Therefore, class D amplifier provides the returned signal V4 to drive the amplify 112. Please refer to FIG. 2, which shows a wave sample of the V1, VTRI, V3 and V4.

Please refer FIG. 3. FIG. 3 shows a full-bridge class D amplifier circuit. In the example, the integrator 32 transmitted the integration result into the comparator 33A and 33B respectively after receiving the differential audio signal Vin+ and Vin−, after both output signals of the comparator go through the pre driver (34A, 34B), the power amplifier circuit (35A, 35B), and low-pass filter (36A, 36B), can be an analog signal used in driver the amplifier 38. The integrator 32 and pre driver 34A, 34B is also called a PWM circuit. As show in FIG. 3, the comparator 33A and 33B have an input end to receive the triangular signal $V_{TRI}$, respectively.

With the explanations previously, both the half-bridge and the full-bridge class D amplifier need a triangular wave to be the standard of the PWM. In the prior art, the triangular wave signal usually is generated from a special circuit outside of the class D amplifier. As known by those skilled in the art, the amplitude and duty cycle of the triangular wave should be quite exact to avoid the inaccuracy of the voice output from the amplifier. Therefore, the triangular wave generation circuit usually is quite complex.

In addition, when the complex triangular wave generation circuit is integrated with the class D amplifier in one single chip, it occupies a large area of the chip, and the cost for producing said chip will be largely increased.

SUMMARY OF THE INVENTION

To solve the aforementioned problem, a scope of the invention is to provide a solution to generate a triangular wave for a class D amplifier. An embodiment according to the invention is a class D amplifier comprises a PWM circuit, a buffer amplifying circuit, a low-pass filter, a first current source, a second current source and a control circuit.

The PWM circuit is used for transferring an analog signal into a PWM signal. The buffer amplifying circuit is used for amplifying the PWM signal and generating an amplified signal. The low-pass filter is applied for filtering a high frequency component out from an amplified signal to generate a filtered signal and then transmitting the filtered signal to a load of the class D amplifier. Both the first current source and the second source are electrically connected to a feedback node in the PWM circuit. The first current source is applied for providing a first current flowing into the feedback node, and the second current source is applied for providing a second current flowing out from the feedback node. The control circuit is used for selectively turning on or off the first current source and the second current source.

Another embodiment according to the invention is also a class D amplifier. The class D amplifier comprises a PWM circuit, a buffer amplifying circuit, a low-pass filter, a first current source, a second current source and a control circuit.

The PWM circuit of the embodiment is used for transferring a differential analog signal into a differential PWM signal. The buffer amplifying circuit is used for amplifying the differential PWM signal and generating a differential amplified signal. The low-pass filter is applied for filtering a high frequency component out from the differential amplified signal to generating a differential filtered signal and then transmitting the differential filtered signal to a loading of the class D amplifier. Both the first current source and the second current source are electrically connected to a feedback node in the PWM circuit. The first current source is used for providing a first current flowing into the feedback node, and the second current source is used for providing a second current flowing out from the feedback node. The control circuit is applied for selectively turning on or off the first current source and the second current source.

The class D amplifier according to the invention applies the current sources to periodically charge and discharge the feedback node in the PWM circuit; it is equal to subtract a specific triangular wave signal from the original integrated result in the PWM circuit. Compared to the prior arts, there is no need for the half-bridge or full-bridge class D amplifier according to the invention to have a complex triangular generation circuit, so as to largely save chip area and hardware cost.

The advantage and spirit of the invention may be understood by the following recitations together with the appended drawings.

BRIEF DESCRIPTION OF THE APPENDED DRAWINGS

Figure 4:
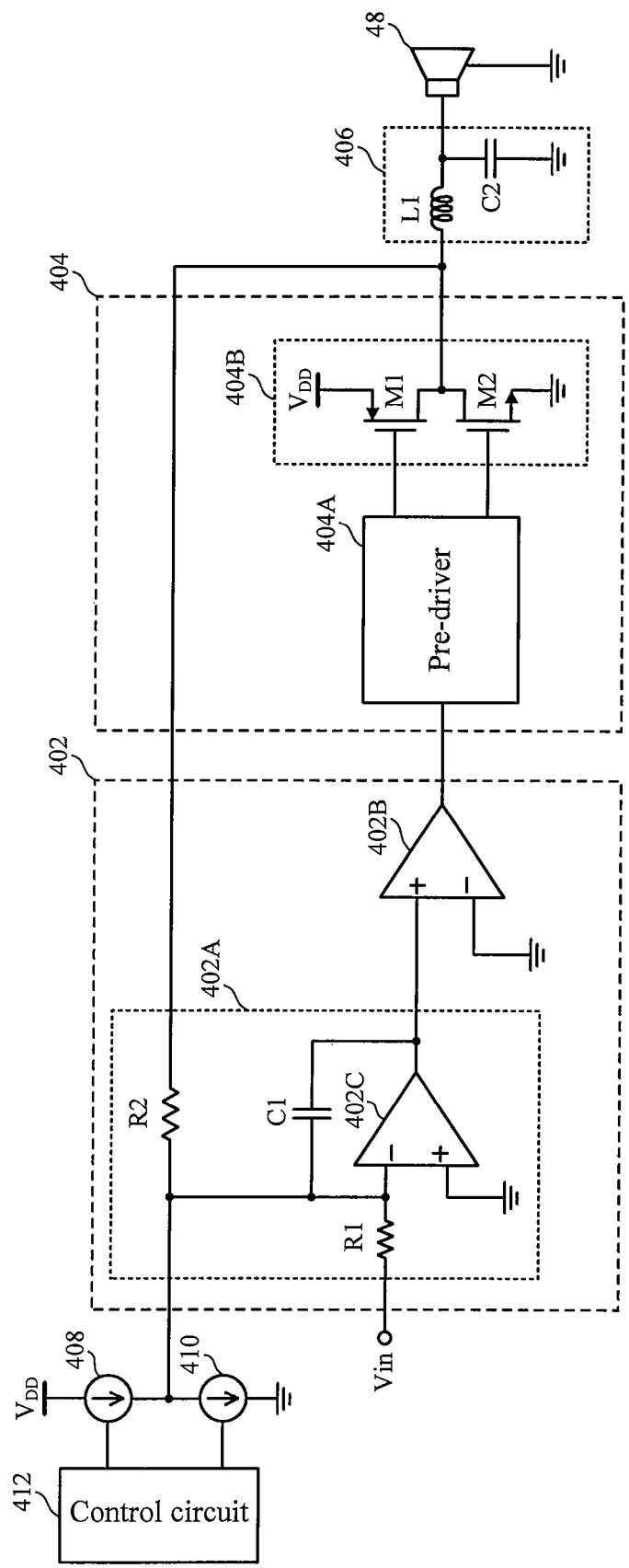
Figure 4:
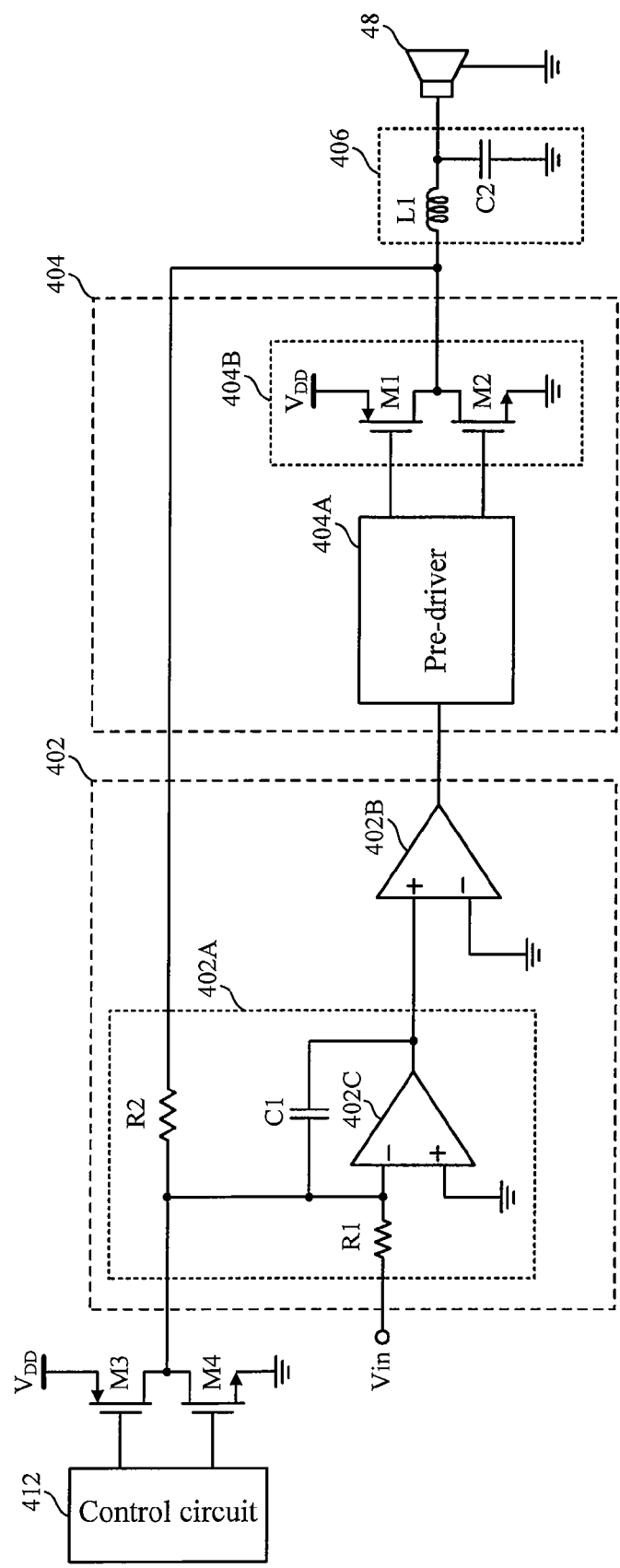

FIG. 4(A) and FIG. 4(B) show the half-bridge class D amplifier in an embodiment according to the invention.

Figure 5:
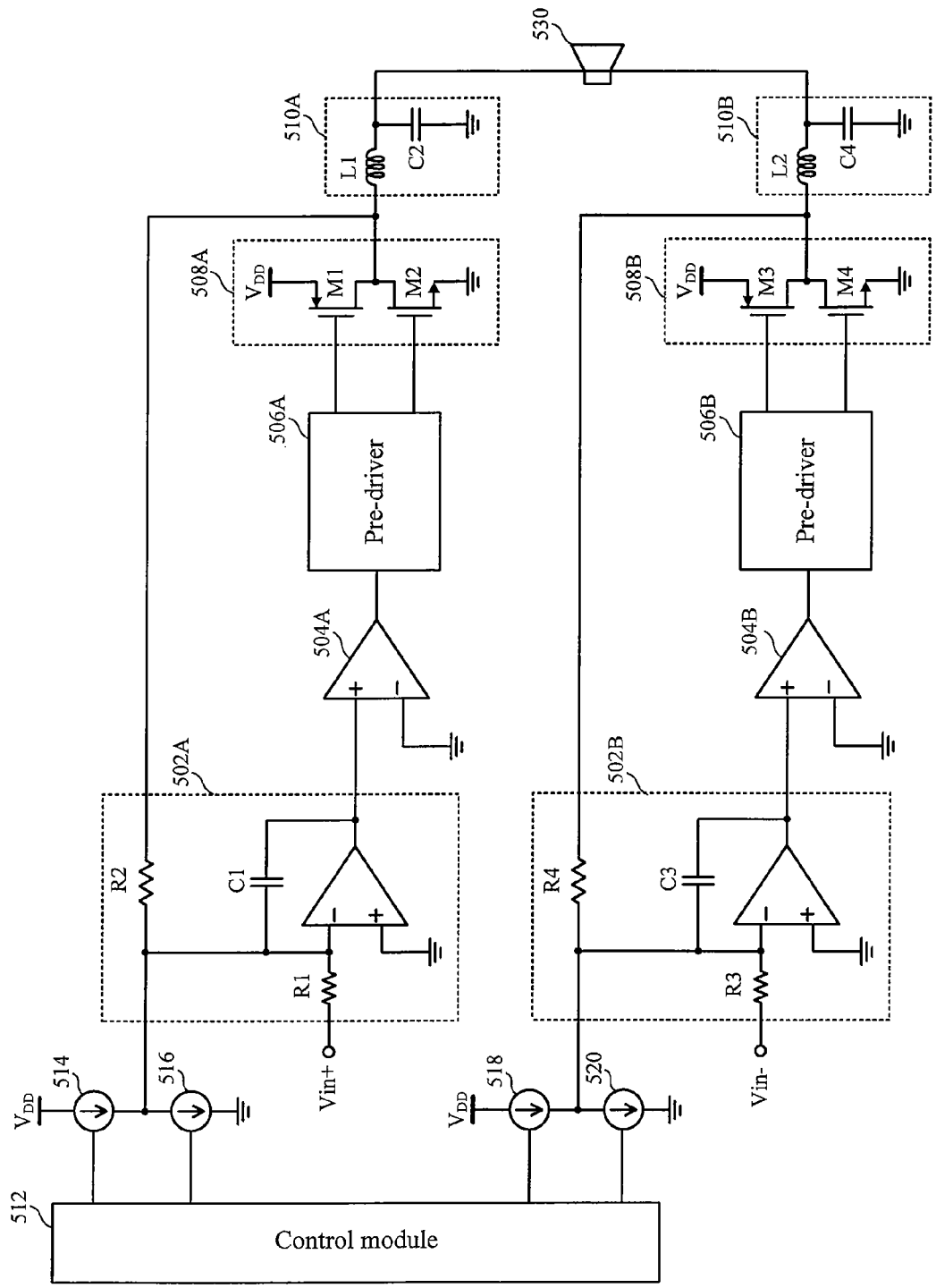
Figure 5:
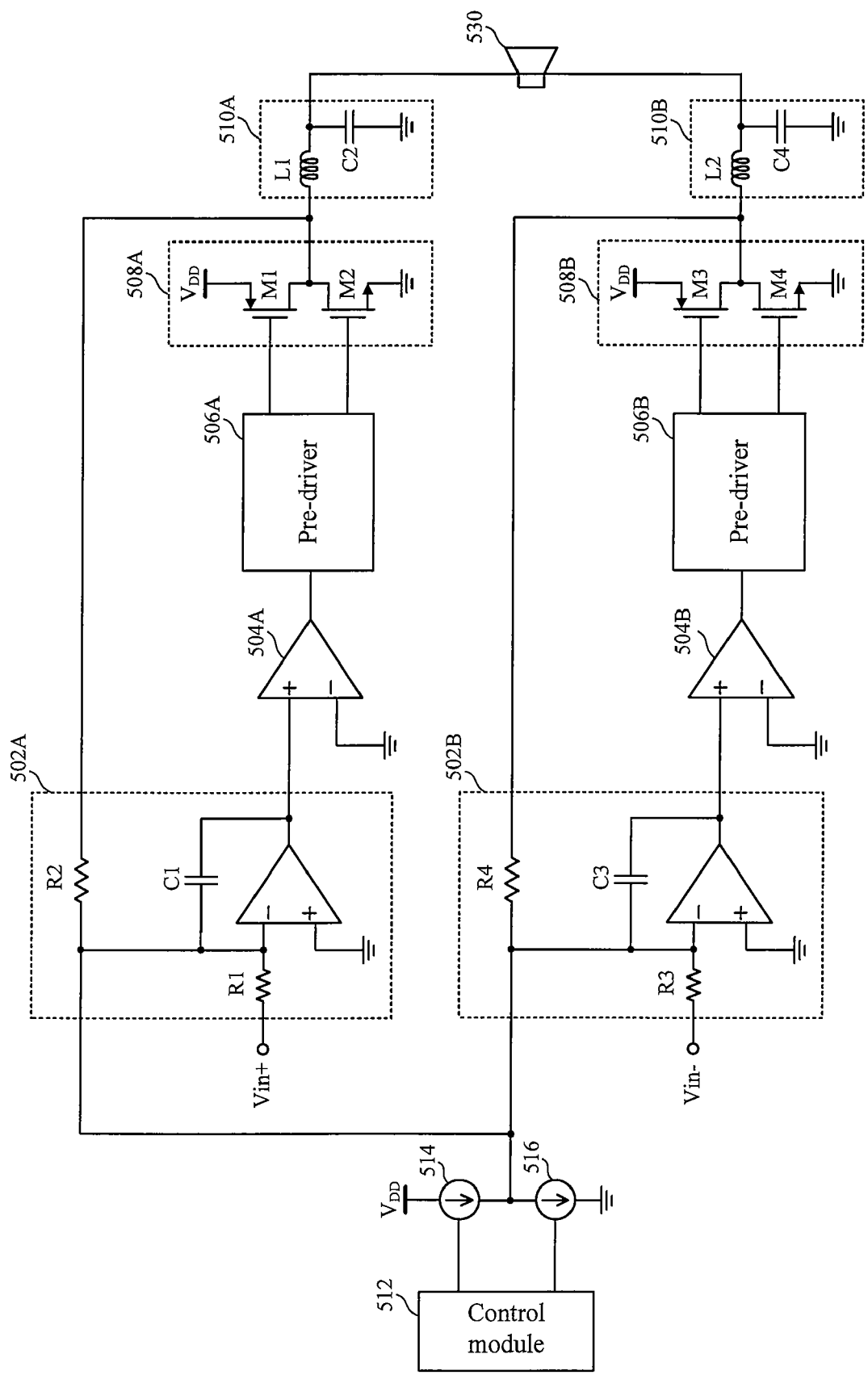

FIG. 5(A) shows the full-bridge class D amplifier in an embodiment according to the invention.

FIG. 5(B) shows the full-bridge class D amplifier in another embodiment according to the invention.

DETAILED DESCRIPTION OF THE INVENTION

Please refer to FIG. 4(A), FIG. 4(A) shows a half-bridge class D amplifier of an embodiment according to the invention. The class D amplifier comprises a PWM circuit 402, a buffer amplifying circuit 404, a low-pass filter 406, a first current source 408, a second current source 410 and a control circuit 412. In the embodiment, the PWM circuit 402 comprises an integrator 402A and a comparator 402B, and the buffer amplifying circuit 404 comprises a pre driver 404A and a power amplifying circuit 404B.

The integrator 402A is composed of an operational amplifier, two resisters and a capacitor. As show in FIG. 4(A), the positive input end of the operational amplifier 402C connected to a ground. The resistor R1 is connected between the negative input end and an input end of the operational amplifier 402C, wherein the input end is used for receiving the analog signal Vin. The capacitor C1 is connected between the negative input end and the output end of the operational amplifier 402C. The resister R2 is connected between the negative input end of the operational amplifier 402C and the output end of the power amplifying circuit 404B. Additionally, the positive input end and the negative input end of the comparator 402B are connected to the output end and the ground of the integrator 402A respectively.

The PWM circuit 402 is applied for transferring the analog signal Vin into a PWM signal. As shown in FIG. 4(A), both the first current source 408 and the second current source 410 are electrically connected to a feedback node in the PWM circuit 402 (i.e. the negative input end of the operational amplifier 402C). The first current source 408 is applied for providing a first current flowing into the feedback node, and the second current source 410 is used for providing a second current flowing out form the feedback node. The control circuit 412 is used for selectively turning on or off the first current source 408 and the second source 410.

For example, the control circuit 412 can alternatively turn on the first current source 408 and the second current source 410, so that the current sources can periodically charge and discharge the feedback node. The presence of the capacitor C1, charging and discharging the feedback node (i.e. charging and discharging the capacitor C1) will result in an increase or decrease of triangular wave voltage at the output end of the operational amplifier 402C, that is equal to add a triangular wave voltage to the original result of integration. The amplitude and the cycle time of the triangular wave voltage can be controlled by controlling the current value and turn on delay time of the first current source 408 and the second current source 410.

If the absolute value of the first current is substantially equal to that of the second current, the average potential of said triangular wave voltage will almost be zero, and the positive wave and the negative wave of said triangular wave voltage is substantially symmetrical. Since there is no specific phase relationship between the triangular wave voltage and the original result of integration, the increase and decrease of voltage at the output end of the operational amplifier 402C can be equal to the subtraction of a triangular wave voltage from the original result of integration. Additionally, the difference between the phase of the triangular wave voltage as a subtrahend and that of the triangular wave voltage as an addend is 180 degree.

Figure 1:
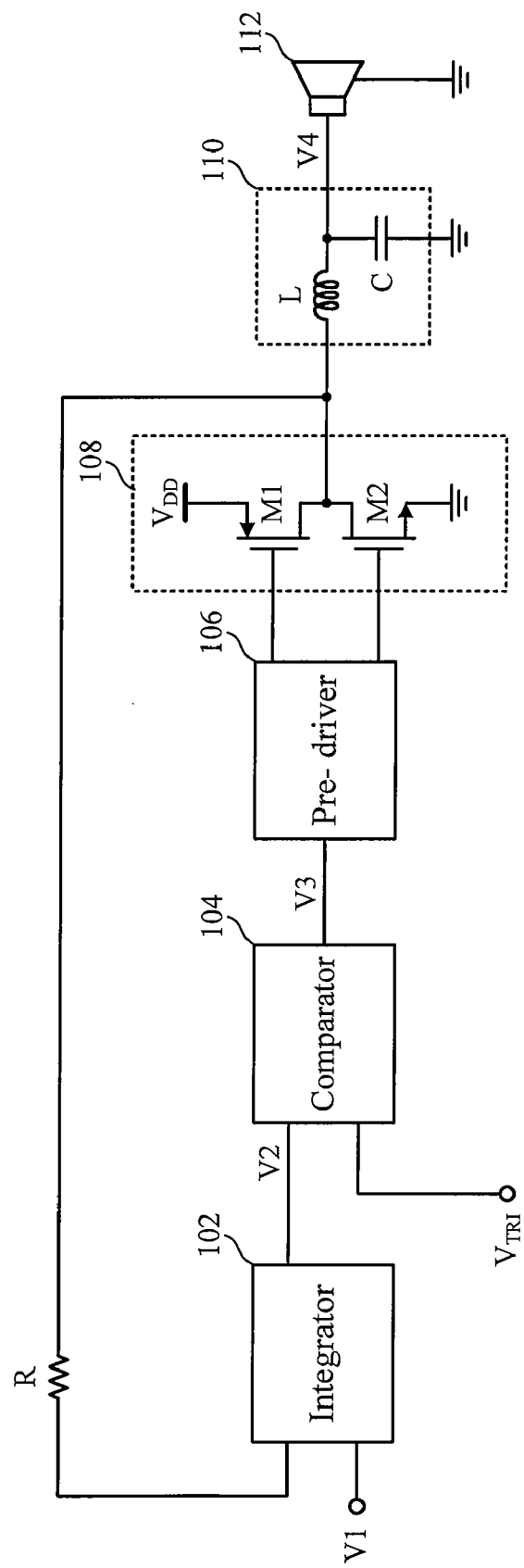
FIG. 1 shows the basic block diagram of the half-bridge class D amplifier.
Figure 2:
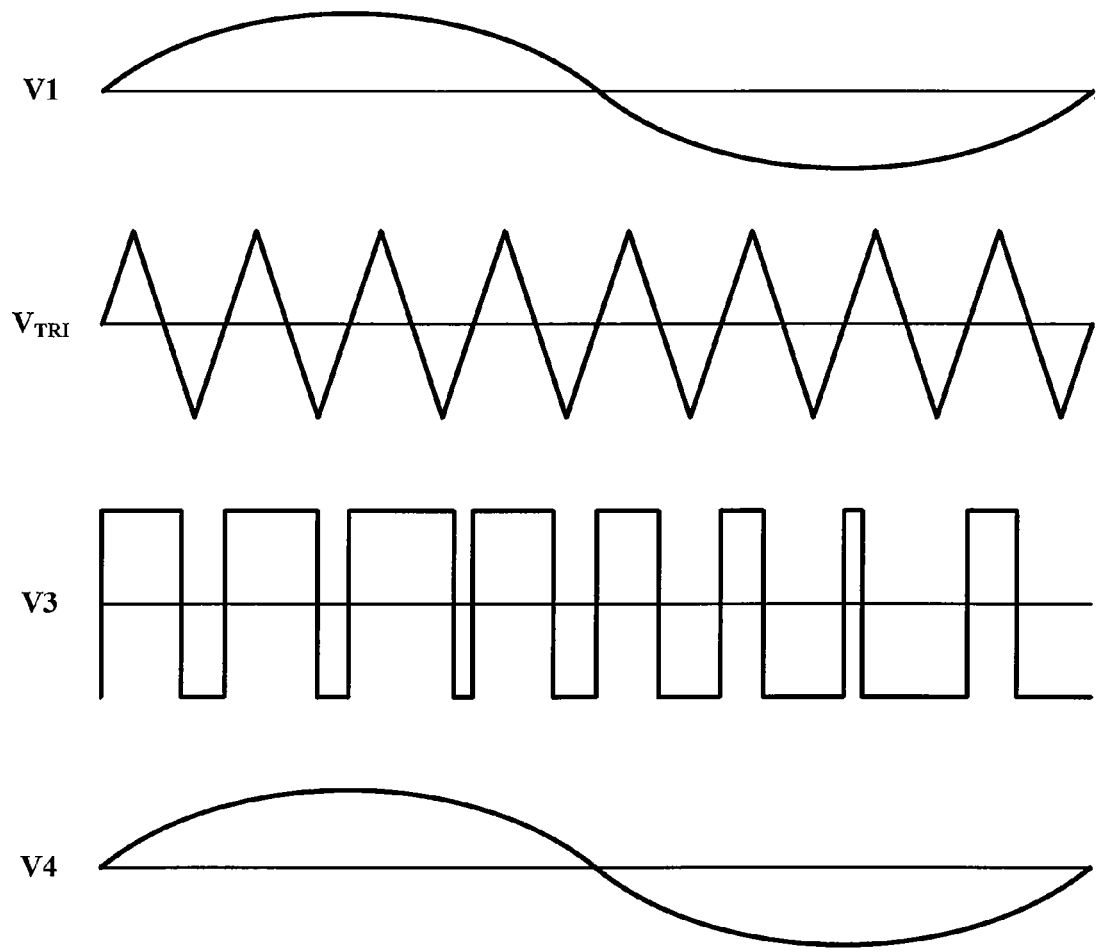
FIG. 2 shows an example of signal wave in the class D amplifier.
Figure 3:
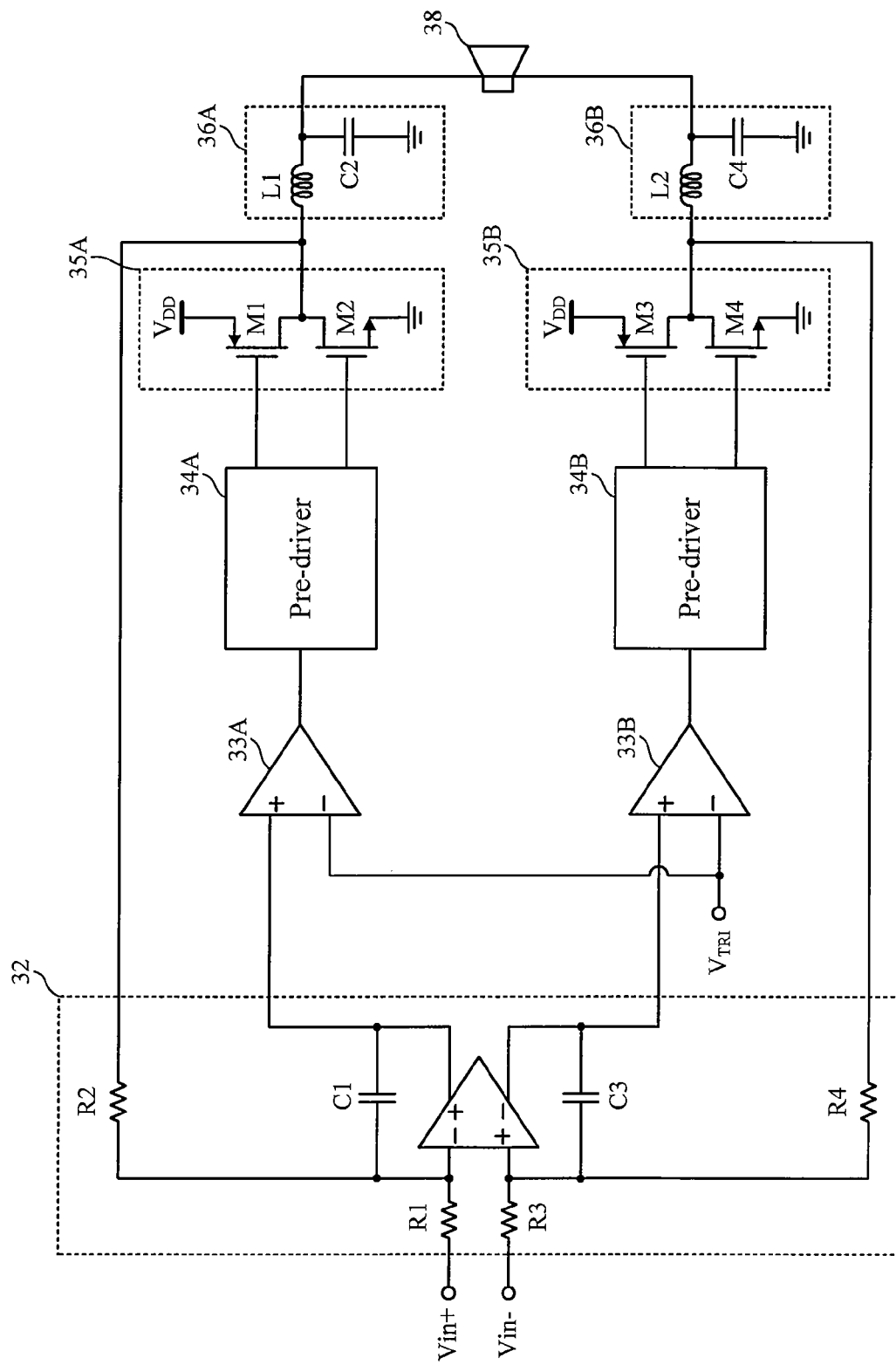
FIG. 3 shows the full-bridge class D amplifier circuit.

As mentioned previously, the comparator 104 in FIG. 1 is applied for comparing the magnitude of V2 and $V_{TRI}$. In other words, the comparator 104 is used for comparing the difference between the ground potential and the voltages V2 and $V_{TRI}$. When the difference between V2 and $V_{TRI}$ is larger then zero, the output voltage of the comparator 104 is at high level.

In the circuit structure of the invention, the output end of the integrator 402A generates the result of subtracting a triangular wave voltage from the original result of integration. Therefore, the comparator 402B compares the output voltage with the ground voltage, which is equal to compare the original result of integration with said triangular wave voltage. Herewith, the PWM circuit 402 according to the invention does not provide the triangular wave signal to the integrator 402A which still has effect of transferring the analog signal Vin into a PWM.

Then, the PWM signal generated by the PWM circuit 402 is sent to a pre driver 404A and a power amplifying circuit 404B and generates an amplified signal. After the low-pass filter 406 is filtering a high frequency component out from the amplifying signal and then transmitting the filtered signal to a loading 48 of the class D amplifier (For example, an amplifier).

In this embodiment, the low-pass filter 406 is composed of an inductance and a capacitor, the power amplifying circuit 404B is composed of power CMOS. In practical applications, the PWM circuit 402, the power amplifying circuit 404B and the low-pass filter 406 are not limited by this embodiment. There are still other possible structures for the PWM circuit 402, the power amplifying circuit 404B and the low-pass 406.

Please refer to FIG. 4(B), FIG. 4(B) shows a sample of the current source. As shown in FIG. 4(B), the first current source 408 is a PMOS (M3) and the second current source 410 is a NMOS. Both gate terminals of the two transistors are connected to a control circuit 412. When the control circuit 412 outputs a low level voltage signal, the transistor M4 will be turned off and the transistor M3 will be turned on to provide a current flow into the feedback node. When the control circuit 412 outputs a high level voltage signal, the transistor M3 will be turned off and the transistor M4 will be turned on and provide a current flow out from the feedback node.

Please refer to FIG. 5(A), FIG. 5(A) shows a full-bridge class D amplifier of an embodiment according to the invention. The full-bridge class D amplifier is suited for the input signal in a differential signal and the circuit usually the same used for modulating, amplifying and filtering the reverse or forward input signal.

In this embodiment, the integrator 502A, 502B are receiving differential audio signal Vin+ and Vin− respectively and then transmitting the result of integration to comparator 504A and 504B respectively. After the output signal of the two comparators have passed through the pre driver (506A, 506B), the power amplifying circuit (508A, 508B) and the low-pass filter (510A, 510B) can be differential analog signals used for driving the amplifier 530.

The method of using the current source to charge and discharge the feedback node according to the invention is also applied to the full-bridge class D amplifier. As shown in FIG. 5(A), the first current source 514 and the second current source 516 are applied for using in the integrator 502 A; the third current source 518 and the fourth current source 520 are applied for using in the integrator 502 B. The control circuit 512 is applied for selectively turning on or off the four current sources, so at to achieve the efficiency of subtracting a specific triangular wave from the original result of the integration of the integrator 502A, 502B. As a result of every units show in FIG. 5(A) similar to every module show in FIG. 4(A), so no repeat again.

Please refer to FIG. 5(B), FIG. 5(B) shows another embodiment according to the invention which is a full-bridge class D amplifier. The difference between this embodiment and the one before is the class D amplifier comprises less current source in this embodiment. As shown in FIG. 5(B), both the first current source 514 and the second current source 516 are electrically connected to the negative input end of the integrator 502A, 502B respectively. The same previous embodiment, so as to suit to selectively control the time of turning on or off of the current sources can have an effect of the differential analog signal transfer into the PWM signal.

In theory, the difference between the phases of the analog differential signals, which were inputted into the class D amplifier, is 180 degrees. Accordingly, the difference between the phases of the analog differential signals applied for driving the load should also be 180 degrees.

As described previously, the triangular wave signal is applied for sampling the result of the integration of reference signal in the PWM circuit. When the integrator 502A and 502B using the same current source (i.e. so that the two integrators use the same sample signal) reduce the phase mismatch of the class D amplifier.

The low-pass filter circuit 406 as show in FIG. 5(A) and FIG. 5(B) both comprise an inductance and a capacitor, the power amplifier circuit comprises a power CMOS. The PWM circuit, the power amplifier circuit and the low-pass filter circuit are not limited by this embodiment. Other possible structures for the PWM circuit exist, the power amplifier circuit and the low-pass filter.

As the example and previous explanations stated, The class D amplifier according to the invention is used to the current source making a cycle charging and discharging to the feedback node in the PWM circuit equal to the original integrate result remove by a specially triangular signal in PWM circuit. Compared to the prior arts, the half-bridge or full-bridge class D amplifier according to the invention all do not have a triangular generation circuit, therefore the invention can save much chip space and hardware cost.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A class D amplifier, comprising:
    a PWM circuit for transferring an analog signal into a PWM signal;
    a buffer amplifying circuit, electrically connected to the PWM circuit, for amplifying the PWM signal and generating an amplified signal;
    a low-pass filter, electrically connected to the buffer amplifying circuit, for filtering a high frequency component out from the amplified signal to generate a filtered signal, and then transmitting the filtered signal to a loading of the class D amplifier;
    a first current source, electrically connected to a feedback node in the PWM circuit, for providing a first current flowing into the feedback node;
    a second current source, electrically connected to the feedback node, for providing a second current flowing out from the feedback node; and
    a control circuit, electrically connected to the first current source and the second current source, for selectively turning on or off the first current source and the second current source,
    wherein the first current source comprises a P type MOSFET.

2. The class D amplifier of claim 1, wherein the PWM circuit comprising:
    a first operational amplifier having a first positive input end, a first negative input end and a first output end, the first positive input end connected to a ground, and the first negative input end being the feedback node;
    a first resistor, electrically connected between the first negative input end and an input end for receiving the analog signal;
    a first capacitor, electrically connected between the first negative input end and the first output end;
    a second resistor, electrically connected between the first negative input end and an input node of the low-pass filter; and
    a second operational amplifier having a second positive input end, a second negative input end and a second output end, and the second negative input end connected to the ground.

3. The class D amplifier of claim 1, wherein the low-pass filter circuit comprises a capacitor and an inductance.

4. The class D amplifier of claim 1, wherein the buffer amplifying circuit comprises a plurality of Power CMOS.

5. A class D amplifier, comprising:
    a PWM circuit for transferring a differential analog single into a differential PWM signal;
    a buffer amplifying circuit, electrically connected to the PWM circuit, for amplifying the differential PWM signal and generating a differential amplified signal;
    a low-pass filter circuit, electrically connected to the buffer amplifying circuit, for filtering a high frequency signal component out from the differential amplified signal to generate a differential filtered signal, and then transmitting the differential filtered signal to a loading of the class D amplifier;
    a first current source, electrically connected to a feedback node in the PWM circuit, for providing a first current flowing into the feedback node;
    a second current source, electrically connected to the feedback node, for providing a second current flowing out from the feedback node; and
    a control circuit, electrically connected to the first current source and the second current source, for selectivity turning on or off the first current source and the second current source,
    wherein the first current source comprises a P type MOSFET.

6. The class D amplifier of claim 5, wherein the differential analog signal comprises a positive analog signal and a negative analog signal, and the PWM circuit comprising:
    a first operational amplifier having a first positive input end, a first negative input end and a first output end, the first positive input end connected to a ground, and the first negative input end being the feedback node;

a first resistor, electrically connected between the first negative input end and a positive input end for receiving the positive analog signal;

a first capacitor, electrically connected between the first negative input end and the first output end;

a second resistor, electrically connected between the first negative input end and a first input node of the low-pass filter circuit;

a second operational amplifier having a second positive input end, a second negative input end and a second output end, the second negative input end connected to the ground, the second positive input end connected to the first output end, and the second output end connected to the buffer amplifying circuit;

a third operational amplifier having a third positive input end, a third negative input end and a third output end, the third positive input end connected to the ground, and the third negative input end being the feedback node;

a third resistor, electrically connected between the third negative input end and a negative input end for receiving the negative analog signal;

a third capacitor, electrically connected between the third negative input end and the third output end;

a fourth resistor, electrically connected between the third negative input end and a second input node of the low-pass filter circuit; and a fourth operational amplifier having a fourth positive input end, a fourth negative input end and a fourth output end, the fourth negative input end connected to the ground, the fourth positive input end connected to the third output end, and the fourth output end connected to the buffer amplifying circuit.

7. The class D amplifier of claim 5, wherein the low-pass filter circuit comprises a capacitor and an inductance.

8. The class D amplifier of claim 5, wherein the buffer amplifying comprises a plurality of Power CMOS.

9. A class D amplifier, comprising:

a PWM circuit for transferring an analog signal into a PWM signal;

a buffer amplifying circuit, electrically connected to the PWM circuit, for amplifying the PWM signal and generating an amplified signal;

a low-pass filter, electrically connected to the buffer amplifying circuit, for filtering a high frequency component out from the amplified signal to generate a filtered signal, and then transmitting the filtered signal to a loading of the class D amplifier;

a first current source, electrically connected to a feedback node in the PWM circuit, for providing a first current flowing into the feedback node;

a second current source, electrically connected to the feedback node, for providing a second current flowing out from the feedback node; and a control circuit, electrically connected to the first current source and the second current source, for selectively turning on or off the first current source and the second current source, wherein the second current source comprises an N type MOSFET.

10. A class D amplifier, comprising:

a PWM circuit for transferring a differential analog single into a differential PWM signal;

a buffer amplifying circuit, electrically connected to the PWM circuit, for amplifying the differential PWM signal and generating a differential amplified signal;

a low-pass filter circuit, electrically connected to the buffer amplifying circuit, for filtering a high frequency signal component out from the differential amplified signal to generate a differential filtered signal, and then transmitting the differential filtered signal to a loading of the class D amplifier;

a first current source, electrically connected to a feedback node in the PWM circuit, for providing a first current flowing into the feedback node;

a second current source, electrically connected to the feedback node, for providing a second current flowing out from the feedback node; and a control circuit, electrically connected to the first current source and the second current source, for selectivity turning on or off the first current source and the second current source, wherein the second current source comprises an N type MOSFET.

* * * * *